United States Patent
Meng et al.

(10) Patent No.: US 12,261,030 B2
(45) Date of Patent: *Mar. 25, 2025

(54) NORMAL-INCIDENCE IN-SITU PROCESS MONITOR SENSOR

(71) Applicant: Tokyo Electron Limited, Tokyo (JP)

(72) Inventors: Ching Ling Meng, Sunnyvale, CA (US); Holger Tuitje, Fremont, CA (US); Qiang Zhao, Milpitas, CA (US); Hanyou Chu, Palo Alto, CA (US); Xinkang Tian, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/605,526

(22) Filed: Mar. 14, 2024

(65) Prior Publication Data

US 2024/0222100 A1 Jul. 4, 2024

Related U.S. Application Data

(60) Division of application No. 17/197,947, filed on Mar. 10, 2021, now Pat. No. 11,951,721, which is a
(Continued)

(51) Int. Cl.
*H01J 37/32* (2006.01)
*H01L 21/66* (2006.01)
(Continued)

(52) U.S. Cl.
CPC .. *H01J 37/32972* (2013.01); *H01J 37/32449* (2013.01); *H01J 37/32963* (2013.01);
(Continued)

(58) Field of Classification Search
CPC .......... H01J 37/32431; H01J 37/32963; H01L 21/67253; H01L 22/26; G01N 21/00
See application file for complete search history.

(56) References Cited

U.S. PATENT DOCUMENTS 3,059,611 A 10/1962 Fury et al.
3,612,692 A 10/1971 Kruppa et al.
(Continued)

FOREIGN PATENT DOCUMENTS

CN 1945440 A 4/2007
CN 101165867 A 4/2008
(Continued)

OTHER PUBLICATIONS

Chinese Office Action issued Jul. 16, 2024 in Chinese Patent Application No. 201980050131.1, (with English translation), 17 pages.
(Continued)

*Primary Examiner* — Mohammad M Choudhry
(74) *Attorney, Agent, or Firm* — Oblon, McClelland, Maier & Neustadt, L.L.P.

(57) ABSTRACT

An apparatus for in-situ etching monitoring in a plasma processing chamber includes a continuous wave broadband light source, an illumination system configured to illuminate an area on a substrate with an incident light beam being directed from the continuous wave broadband light source at normal incidence to the substrate, a collection system configured to collect a reflected light beam being reflected from the illuminated area on the substrate, and to direct the reflected light beam to a first light detector, and a controller. The controller is configured to determine a property of the substrate or structures formed thereupon based on a reference light beam and the reflected light beam, and control an etch process based on the determined property. The reference light beam is generated by the illumination system by splitting a portion of the incident light beam and directed to a second light detector.

10 Claims, 8 Drawing Sheets

Related U.S. Application Data continuation of application No. 16/051,082, filed on Jul. 31, 2018, now Pat. No. 10,978,278.

(51) Int. Cl.
*H01L 21/67* (2006.01)
*G01N 21/00* (2006.01)

(52) U.S. Cl.
CPC ........ *H01L 21/67253* (2013.01); *H01L 22/26* (2013.01); *G01N 21/00* (2013.01); *H01J 37/32458* (2013.01); *H01J 2237/3345* (2013.01)

(56) References Cited

U.S. PATENT DOCUMENTS

| | | | |
|---|---|---|---|
| 4,147,435 | A | 4/1979 | Habegger |
| 5,091,320 | A | 2/1992 | Aspnes et al. |
| 6,160,621 | A | 2/2000 | Perry et al. |
| 6,650,426 | B1 | 11/2003 | Zalicki |
| 7,557,926 | B2 | 7/2009 | Griffiths et al. |
| 7,705,331 | B1 | 4/2010 | Kirk et al. |
| 8,092,695 | B2 | 1/2012 | Grimbergen |
| 8,158,526 | B2 | 4/2012 | Grimbergen |
| 8,415,884 | B2 | 4/2013 | Chen et al. |
| 8,642,136 | B2 | 2/2014 | Kushibiki et al. |
| 9,059,038 | B2 | 6/2015 | Li et al. |
| 9,870,935 | B2 | 1/2018 | Budiarto et al. |
| 9,887,068 | B2 | 2/2018 | Iwasaki |
| 2004/0035529 | A1 | 2/2004 | Grimbergen |
| 2004/0207836 | A1 | 10/2004 | Chhibber et al. |
| 2005/0118735 | A1 | 6/2005 | Mantz et al. |
| 2005/0146719 | A1 | 7/2005 | Chhibber et al. |
| 2005/0185174 | A1 | 8/2005 | Laan |
| 2008/0099435 | A1 | 5/2008 | Grimbergen |
| 2008/0099436 | A1 | 5/2008 | Grimbergen |
| 2008/0176149 | A1 | 7/2008 | Grimbergen |
| 2008/0261335 | A1 | 10/2008 | Grimbergen |
| 2009/0014409 | A1 | 1/2009 | Grimbergen |
| 2010/0086670 | A1 | 4/2010 | Kushibiki et al. |
| 2010/0101728 | A1 | 4/2010 | Iwasaki |
| 2012/0132617 | A1 | 5/2012 | Matsushima |
| 2014/0290860 | A1 | 10/2014 | Iwasaki |
| 2016/0141193 | A1 | 5/2016 | Pandev et al. |
| 2018/0108515 | A1 | 4/2018 | Iwasaki |

FOREIGN PATENT DOCUMENTS

| | | |
|---|---|---|
| CN | 101414092 A | 4/2009 |
| CN | 101494159 A | 7/2009 |
| CN | 102460129 A | 5/2012 |
| CN | 103026210 A | 4/2013 |
| CN | 105874569 A | 8/2016 |
| CN | 106876236 A | 6/2017 |
| CN | 107003624 A | 8/2017 |
| EP | 1 926 125 A1 | 5/2008 |
| JP | 8-139076 A | 5/1996 |
| JP | 11-087448 A | 3/1999 |
| JP | 2001-210619 A | 8/2001 |
| JP | 2008-112167 A | 5/2008 |
| JP | 2009-164445 A | 7/2009 |
| JP | 2009-534854 A | 9/2009 |
| JP | 2013-504063 A | 2/2013 |
| KR | 2003-0000274 A | 1/2003 |

OTHER PUBLICATIONS

Office Action issued Dec. 13, 2023, in Korean Patent Application No. 10-2021-7004416 (with English-language translation).

Combined Chinese Office Action and Search Report issued Oct. 10, 2023 in Chinese Application 201980050131.1, (with English translation), 22 pages.

Combined Taiwanese Office Action and Search Report issued Jun. 5, 2023 in Taiwanese Patent Application No. 108126709 (with English Translation), 11 pages.

International Search Report and Written Opinion issued Jun. 29, 2018 in PCT/US2018/022209, filed Mar. 13, 2018 12 pp.

Office Action mailed Aug. 19, 2019 in U.S. Appl. No. 15/472,494, 11 pages.

International Search Report and Written Opinion issued Nov. 13, 2019 in PCT/US2019/043087, 14 pages.

Written Opinion dated Oct. 19, 2020 issued in Singapore Patent Application No. 11201908990S.

International Preliminary Report on Patentability and Written Opinion issed Feb. 2, 2021 in PCT/US2019/043087.

Office Action issued Oct. 18, 2024, in corresponding Chinese Patent Application No. 201980050131.1 (with English Translation), 17 pages.

Combined Chinese Office Action and Search Report dated Apr. 19, 2024 in Chinese Application No. 201980050131.1, with English translation, 33 pgs.

NORMAL-INCIDENCE IN-SITU PROCESS MONITOR SENSOR

RELATED APPLICATION

This application is a divisional of and claims the benefit of priority under 35 U.S.C. § 120 from U.S. patent application Ser. No. 17/197,947, filed on Mar. 10, 2021, which is a continuation of U.S. patent application Ser. No. 16/051,082 filed on Jul. 31, 2018, now U.S. Pat. No. 10,978,278, issued on Apr. 13, 2021. The entire contents of the above-identified applications are incorporated herein by reference in their entirety.

BACKGROUND

The present disclosure relates to in-situ etch process monitoring, and, more particularly, to methods, systems, and apparatuses for real-time in-situ film properties monitoring of the plasma etch process.

Plasma etch processes are commonly used in conjunction with photolithography in the process of manufacturing semiconductor devices, liquid crystal displays (LCDs), light-emitting diodes (LEDs), and some photovoltaics (PVs).

In many types of devices, such as semiconductor devices, a plasma etch process is performed in a top material layer overlying a second material layer, and it is important that the etch process be stopped accurately once the etch process has formed an opening or pattern in the top material layer, without continuing to etch the underlying second material layer. The duration of the etch process has to be controlled accurately so as to either achieve a precise etch stop at the top of an underlying material, or to achieve an exact vertical dimension of etched features.

For purposes of controlling the etch process various methods are utilized, some of which rely on analyzing the chemistry of a gas in a plasma processing chamber in order to deduce whether the etch process has progressed, for example, to an underlying material layer of a different chemical composition than the material of the layer being etched.

Alternatively, in-situ metrology devices (optical sensors) can be used to directly measure the etched layer during the etch process and provide feedback control for accurately stopping the etch process once a certain vertical feature has been attained. For example, in a generic spacer application the goal for an in-situ optical sensor for film thickness monitoring is to stop anisotropic oxide-etch at a few nm before touchdown (soft landing), then switch to isotropic etching to achieve an ideal spacer profile. Further, the in-situ metrology devices may be used for real-time actual measurement of the films and etch features during the etch process to determine information about the sizes of structures which can be used to control the etch process and/or to control subsequent processes (e.g., a process to compensate for a certain out-of-specification dimension).

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

An aspect of the present disclosure includes an apparatus for in-situ etching monitoring in a plasma processing chamber. The apparatus includes a continuous wave broadband light source, an illumination system configured to illuminate an area on a substrate with an incident light beam being directed at normal incidence to the substrate, a collection system configured to collect a reflected light beam being reflected from the illuminated area on the substrate, and direct the reflected light beam to a detector, and processing circuitry. The processing circuitry is configured to process the reflected light beam to suppress (e.g., filter or subtract) background light, determine a property (e.g., thickness) of the substrate or structures formed thereupon, based on reference light beam and the reflected light beam, and control an etch process based on the determined property.

Another aspect of the present disclosure includes a plasma processing system. The system includes a plasma processing chamber and a normal incidence reflectometer with zero degree AOI (angle of incidence). The normal incidence reflectometer includes a continuous wave broadband light source, a detector, an illumination system configured to illuminate an area on a substrate disposed in the plasma processing chamber with an incident light beam being directed at normal incidence to the substrate, a collection system configured to collect a reflected light beam being reflected from the illuminated area on the substrate, and direct the reflected light beam to the detector, and processing circuitry. The processing circuitry is configured to process the reflected light beam to suppress background light, determine a property of the substrate or structures formed thereupon based on reference light beam and the reflected light beam that are processed to suppress the background light, and control an etch process based on the determined property.

Yet another aspect of the present disclosure includes a method for in-situ etch monitoring. In the disclosed method, incident light beam is directed at normal incidence to a substrate disposed in a plasma processing chamber, and the incident light generates an illuminated area on surface of the substrate. In addition, a portion of the incident light beam is split to a detector to collect a reference light beam. Background light generated from the plasma and a reflected light beam is also collected from the illuminated area. Further, the reflected light beam is processed to suppress the background light. A property of the substrate or structures formed thereupon is determined based on the reference light beam and the reflected light beam by using an algorithm or a reference library, and the etch process is controlled based on the determined property.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
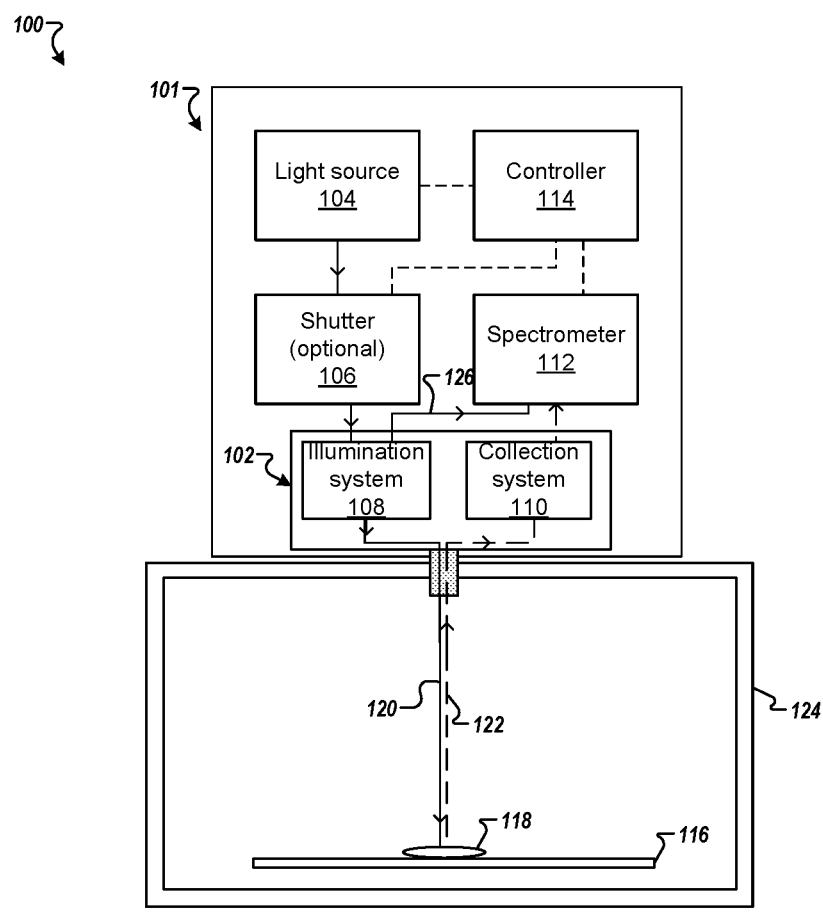
FIG. 1 is a schematic diagram of a system for etch process monitoring in accordance with some embodiments.

Referring now to the drawings, wherein like reference numerals designate identical or corresponding parts throughout several views, the following description relates to a system and associated methodology for real-time in-situ film properties monitoring of a plasma process of patterned or un-patterned wafer in semiconductor manufacturing.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

FIG. 1 is a side view schematic of a plasma processing system 100 equipped with an optical sensor 101 according to one example. The plasma processing system 100 further includes a plasma processing chamber 124.

Figure 2:
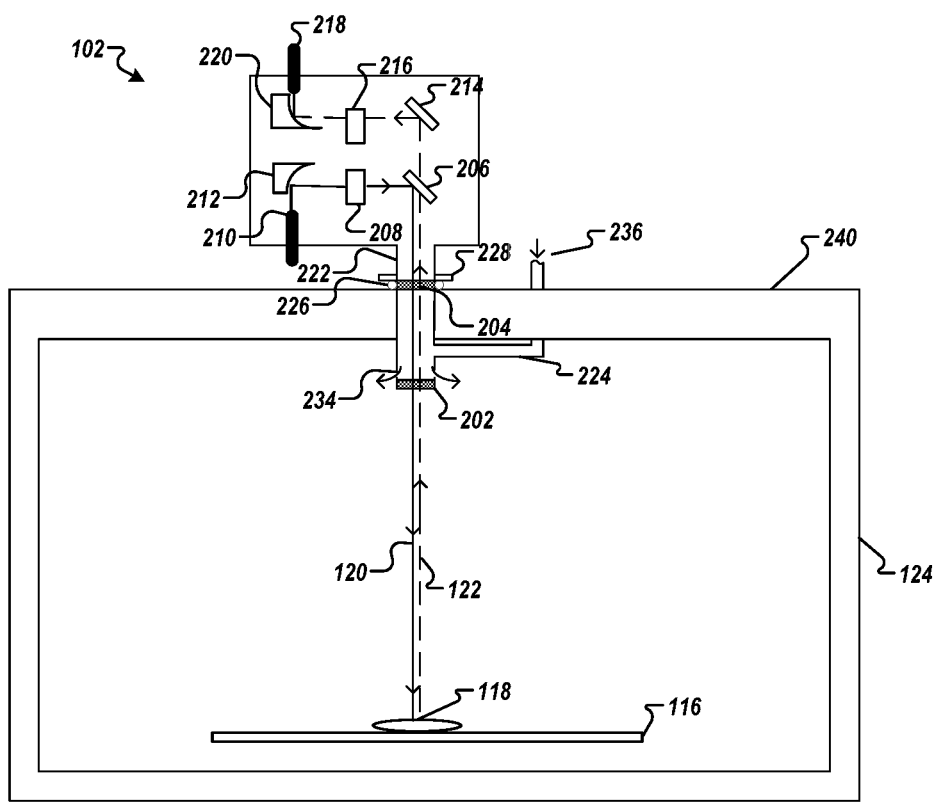
FIG. 2 is a schematic diagram of an exemplary optics module in accordance with some embodiments.

The optical sensor 101 can be a normal incidence reflectometer with zero degree angle of incidence (AOI) that includes an optics module 102 (illumination and collection), a light source 104, a shutter 106, spectrometer 112 and a controller 114. The optical sensor 101 generates an incident light beam 120 from the light source 104 and receives a reflected light beam 122 for analysis. The incident light beam 120 and the reflected light beam 122 propagate along the normal to the substrate 116 in the plasma processing chamber 124. The optics module 102 further includes an illumination system 108 and a collection system 110. The optical sensor 101 is configured for measuring the reflected light beam 122 from an illuminated area 118 on a substrate 116 during a plasma etching process in the plasma processing chamber 124. The illuminated area 118 may be adjustable as a function of the size of the substrate 116. In one embodiment, the optics module 102 may be located outside of the plasma processing chamber 124. In another embodiment, the optics module 102 can be installed in the plasma processing chamber. As shown in FIG. 2, the optics module 102 can be installed inside a tube, and the tube is made of stainless steel or aluminum alloy and inserted into the plasma processing chamber 124 through a top wall of the plasma processing chamber 124.

In the optical sensor 101, the light source 104 is used to form the incident light beam 120 for substrate illumination. In an embodiment, the light source 104 is a broadband light source such as continuous wave (CW) broadband light source, for example a laser driven plasma light source (LDLS) that provides light with very high brightness across a broad spectrum UV (ultraviolet)-Vis (visible)-NIR (near infrared) (i.e., 190 nm-2000 nm) with a long-life bulb (>9000 hours) such as EQ-99X LDLS™ from ENERGETIQ. In one embodiment, the light source 104 may be fiber coupled to the illumination system 108 after being modulated by an optional shutter 106. In another embodiment, the light source 104 may be fiber coupled to the illumination system 108 directly without passing through the shutter 106.

The light source 104 may or may not be mounted proximate to the plasma processing chamber 124 or any enclosure housing the optical sensor 101, and in the case of being mounted remotely, the incident light beam 120 can be fed into other components proximate to the plasma processing chamber 124 by an optical fiber, or by a set of optical components such as mirrors, prisms, and lenses as described later herein. The optical sensor 101 may also include relay optics and polarizers for the incident and reflected light beams. In one example, the relay optics use parabolic mirrors to direct the beams and minimize optical aberrations.

The incident light beam 120 is being reflected from the illuminated area 118 on substrate 116 to form the reflected light beam 122. The optical sensor 101 also includes a detector such as spectrometer 112. The spectrometer 112 can be a dual-channel broad-band high SNR (signal to ratio) spectrometer including a measurement channel (i.e., measurement spectrometer) for measuring the spectral intensity of the reflected light beam 122 and a reference channel (i.e., reference spectrometer) for measuring the spectral intensity of a reference light beam 126. The measurement channel of spectrometer 112 may be fiber coupled to the collection system 110.

Before the incident light beam 120 is directed at normal incidence to the substrate 116, a portion of the incident light beam 120 is split to serve as the reference light beam 126 and the reference light beam 126 is subsequently directed to a reference channel of spectrometer 112 (i.e., reference spectrometer). The purpose of collecting the reference light beam 126 is to monitor the spectral intensity of the incident light beam 120 so any changes of the intensity of incident light beam 120 can be accounted for in the measurement process. Such changes of intensity may occur due to drifting output power of light source 104, for example, which drift can be wavelength-dependent. In another implementation, the intensity of the reference light beam 126 may be measured by one or more photodiodes or the like. For example, a photodiode may detect the reference light beam and provide a reference signal that is proportional to the intensity of the incident light beam 120 which is integrated across the entire illumination spectrum (e.g., UV-VIS-NIR).

Figure 3A:
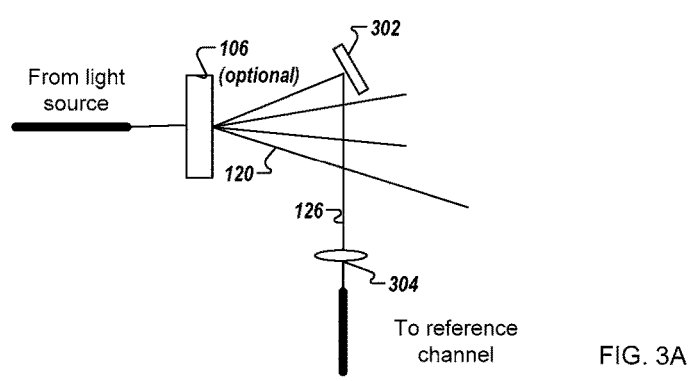
FIG. 3A is a schematic view of a first exemplary configuration to obtain a reference beam in accordance with some embodiments.
Figure 3B:
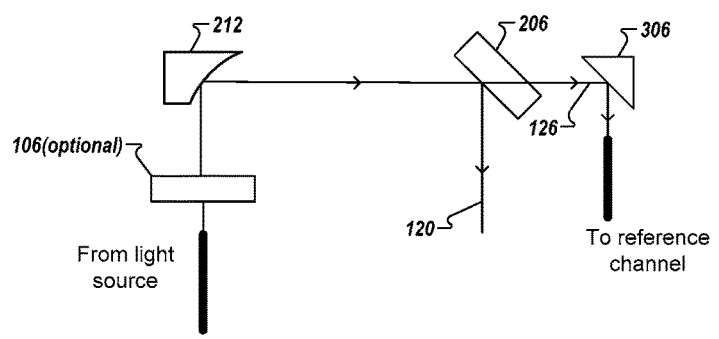
FIG. 3B is a schematic view of a second exemplary configuration to obtain a reference beam in accordance with some embodiments.

In one implementation, the intensity of the reference light beam 126 may be measured using a set of photodiodes. For example, the set of photodiodes may include three photodiodes, spanning UV-VIS-NIR wavelength respectively. A filter may be installed in front of each photodiode of the set of photodiodes. For example, band pass filters may be used to monitor a portion of the spectrum (e.g., UV, VIS, NIR) for intensity variation of the light source 104. In one implementation, the reference light beam may be dispersed using a prism or a grating into the set of photodiodes. Spectrally-dependent intensity variation of the light source 104 may thus be tracked and corrected for without the use of a reference spectrometer. Exemplary configurations for obtaining the reference light beam are shown in FIGS. 3A and 3B discussed below.

The incident light beam 120 can be modulated by a chopper wheel or shutter 106 in order to account for the background light (i.e., light which is not indicative of the reflected light of the incident light beam 120 such as plasma light emission or equipment light in the plasma processing chamber) measured by the measurement channel of spectrometer 112 when the incident light beam 120 is blocked by the shutter 106.

In another embodiment, the chopper wheel or the shutter 106 can be omitted in the optical sensor 101. The incident light beam 120 can be fiber coupled to the illumination system 108 directly through the light source 104. In such an embodiment, the background light due to the plasma light emission or equipment lights can be filtered out from the reflected light beam through signal processing algorithms.

The measured spectral intensity of the background light collected from the plasma processing chamber 124 when the shutter blocks the incident light, the measured spectral intensity of the reflected light beam 122 and the measured spectral intensity of the reference light beam 126 are provided to a controller 114. The controller 114 processes the measured spectral intensity of the reflected light beam 122 to suppress the background light. For example, the controllers 114 can subtract the spectral intensity of the background light from the spectral intensity of the reflected light beam 122. In addition, the measured spectral intensity of the reference light beam 126 can be analyzed by the controller 114 to monitor any intensity change of incident light beam 120 and the intensity changes of incident light beam 120 can be accounted for in the measurement process. The controller 114 uses special algorithms, such as a machine learning algorithm to determine a property or multiple properties for a layer of interest (e.g., feature dimension, optical properties), based on the reference light beam and the reflected light beam that are processed to suppress the background light to control the plasma etching process as described further below.

In another embodiment, the shutter 106 is not introduced in the optical sensor 101, and the light source 104 may be fiber coupled to the illumination system 108 directly without passing through the shutter 106. The controller 114 can use algorithms to calculate spectral intensity of the background light from the measured spectral intensity of the reflected light beam 122. The controller 114 can further process the measured spectral intensity of the reflected light beam 122 to suppress (e.g., filter or substrate) the background light based on the calculated spectral intensity of the background light, or alternatively, if the interference from background light is sufficiently low, no correction for background illumination may be required.

The optical sensor 101 and associated methodologies can also use periodic measurements on a reference wafer (calibration), such as a bare silicon wafer, to compensate for optical sensor or etch chamber components drifts as described later herein.

Still referring to FIG. 1, the controller 114 is connected with the light source 104, the shutter 106 and the spectrometer 112. The controller 114 can acquire data from the light source 104, the shutter 106 and the spectrometer 112, and process the acquired data. The controller 114 can send instructions to the light source 104, the shutter 106 and the spectrometer 112 according to processed data.

FIG. 2 is a schematic view of the optics module 102 according to one example. As shown in FIG. 2, the optics module 102 can be integrated inside and on top of a tube 222. The tube 222 can be made of stainless steel, aluminum alloy, dielectric material, or the like. The tube 222 can be inserted into the plasma processing chamber 124 through an upper wall 240 of the plasma processing chamber. A bottom portion of the tube 222 may protrude through the upper wall 240. The tube 222 can be positioned at the center of the top wall of the plasma processing chamber. The tube 222 can also be located off-center depending on the measurement requirements. The tube 222 can use a vacuum seal 226 and a vacuum seal flange 228 to be mounted against the upper wall 240. The tube 222 can optionally include a gas supply pipe 224 that is connected with a side portion of the tube 222 and can be used to inject processing gas or a purge gas 236 to the plasma processing chamber 124 through gas injection holes 234. The tube 222 can include a lower window 202 configured to prevent contamination from the plasma processing chamber to the inside of tube. In an embodiment, the lower window 202 can be perforated and the gas 236 can be allowed to escape from the lower window 202. The tube 222 can also include an upper window 204. The upper window 204 is configured to serve as a vacuum seal where a portion above the upper window 204, of the tube 222 is under atmospheric pressure, and the other portion below the upper window 204, of the tube, is under vacuum. The lower window 202 can be quartz, fused silica, or sapphire. The upper window can also be quartz, fused silica, or sapphire according to requirements which may include resistance of window material to aggressive chemistries in plasma processing chamber 124, and the need to transmit needed wavelength, including in the deep UV part of the spectrum, for example.

The optics module 102 includes the illumination system 108 and the collection system 110. As shown in FIG. 2, the illumination system 108 can include a first off-axis parabolic mirror 212, a first polarizer 208, and a beam splitter 206. In some embodiments, the first off-axis parabolic mirror 212 is a 90° off-axis parabolic mirror. The collection system 110 can include a second off-axis parabolic mirror 220, a second Rochon polarizer 216, and a fold mirror 214. In some embodiments, the second off-axis parabolic mirror 220 is another 90° off-axis parabolic mirror. In an exemplary operation, the incident light beam 120 is generated by the light source 104 and guided to the first off-axis parabolic mirror 212 through fiber 210. The first off-axis parabolic mirror 212 can be mirrors coated with high-reflectance coatings, such as aluminum, gold, or the like. The first off-axis parabolic mirror 212 is configured to direct the incident light beam 120 and minimize optical aberrations. The incident light beam 120 is directed by the first off-axis parabolic mirror 212 to the first polarizer 208.

The optional first polarizer 208, if present, imposes a linear polarization to the incident light beam 120 that reaches the substrate 116. The first polarizer 208 may be a Rochon Polarizer with high extinction ratio, large e- and o-ray separation, for example, a MgF2 Rochon polarizer, an Alpha-BBO Rochon Polarizer, or the like. Polarization of the incident light beam 120 increases the signal to noise ratio of the reflectometer signal, and thereby improves measurement accuracy and improves sensitivity of feature dimension measurements compared to an un-polarized incident light beam.

After passing through the first polarizer 208, the incident light beam 120 reaches the beam splitter 206. The beam splitter 206 can direct the incident light beam 120 at normal incidence toward the substrate 116 and generate the illuminated area 118. The beam splitter 206 can further split a portion of the incident light beam 120 to form the reference light beam 126 and the reference light beam 126 is subsequently directed to the reference channel of the spectrometer 112 by other optical components, which is illustrated in FIGS. 3A-3B. The beam splitter can be a cube made from two triangular glass prisms, a half-silvered mirror, or a dichroic mirrored prism, or the like.

The size of the illuminated area 118 on substrate 116 can vary from 50 microns to 60 mm (millimeters) or more. The shape of the illuminated area 118 can be circular, but may also be changed into a non-circular shape by the use of an aperture mask inserted into any of the incident light beam 120 or reflected light beam 122 (not shown). The size of the illuminated area 118 may depend on the sizes and characteristics of the structures being measured on the substrate 116 and may be adjustable to ensure good signal. The illuminated area 118 may cover multiple structures on the substrate 116. Thus, the detected optical properties (e.g., index of refraction) may represent an average of the features associated with the many structures on the substrate 116.

In an embodiment, the incident light beam 120 may be passed through an aperture (not shown) that is located prior to the first off-axis parabolic mirror 212. The aperture may be modified to generate an illuminated spot having different shapes (e.g., rectangular, square). Subtle modification to the aperture can be used to efficiently optimize the size and shape of the illuminated area on the substrate, for example based on the sizes and characteristics of the structures being measured.

The incident light beam 120 is therefore reflected from the surface of the substrate 116 to generate the reflected light beam 122. The reflected light beam 122 is passed through the lower window 202, the upper window 204, and the beam splitter 206. It should be noted that the beam splitter 206 is designed to allow the propagation of the reflected light beam 122 with minimum signal loss. The reflected light beam 122 is then directed by the fold mirror 214 to the optional second Rochon Polarizer 216. The second Rochon polarizer 216, if present, is configured to only allow p-polarized light reflected from the substrate 116 to be measured. After passing through the second Rochon polarizer 216, the reflected light beam 122 is passed through the second off-axis parabolic mirror 220. After passing through the second off-axis parabolic mirror 220, the reflected light beam 122 can be collected via optical fiber 218 and directed to the measurement channel of the spectrometer 112. The optical fiber 218 is coupled to the measurement channel of the spectrometer 112. The second off-axis parabolic mirror 220 may be similar to the first off-axis parabolic mirror 212. In various embodiments of optical sensor 101, no polarizers, or one or both optional polarizers 208 and 216 may be used, depending on the signal-to-noise requirements and other measurement requirements.

In further embodiments, the optical sensor 101 illustrated in FIG. 2 can include other optical components, such as mirrors, prisms, lenses, spatial light modulators, digital micro-mirror devices, and the like, to steer the incident light beam 120 and the reflected light beam 122. The configuration and component layout of the optical sensor 101 of FIG. 2 does not necessary need to be as shown exactly in FIG. 2. By way of additional optical components, the light beams can be folded and steered to facilitate packaging the in-situ optical sensor into a compact packaging suitable for mounting on the wall of the plasma processing chamber 124.

FIG. 3A is a first exemplary configuration to obtain a reference light beam according to one example. From the shutter 106, a portion of the light output can serve as the reference light beam 126 and can be directed by a mirror 302 into a reference channel of the spectrometer 112. The reference light beam may be focused into the optical fiber using a lens 304.

FIG. 3B is a second exemplary configuration to obtain a reference light beam according to one example. The beam splitter 206 in the path of the incident light beam 120 can be used to direct a portion of the incident light beam into the reference channel of the spectrometer 112. A prism 306 may be used to focus the reference light beam 126 into the optical fiber. In one implementation, the intensity of the reference light beam may be measured using one or more photo detectors (e.g., UV, Vis, NIR) connected to the controller 114 as discussed previously herein.

Figure 3C:
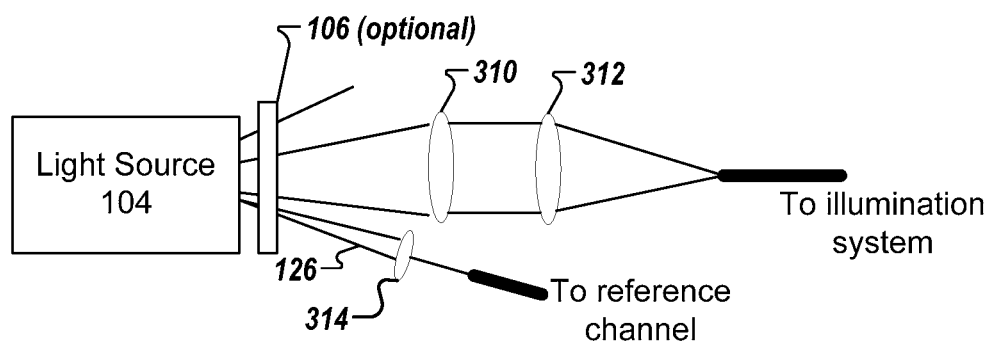
FIG. 3C is a schematic view of a third exemplary configuration to obtain a reference beam in accordance with some embodiments.
Figure 3D:
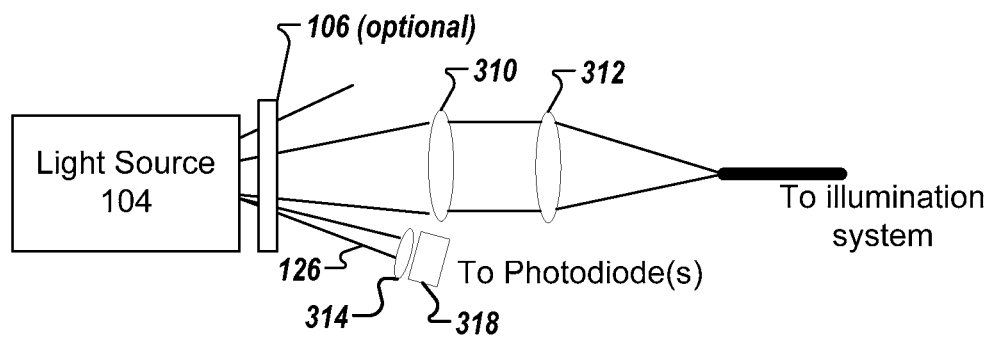
FIG. 3D is a schematic view of a fourth exemplary configuration to obtain a reference beam in accordance with some embodiments.

FIGS. 3C and 3D provide a third and a fourth configurations respectively to measure the light intensity of the reference light beam directly at the light source output. In FIG. 3C, a portion of the light output generated by the light source 104 can transmit through the shutter 106 that is optional and can be omitted, a lens 310, a lens 312, and received by an optical fiber. The optical fiber further guides the received light beam to the illumination system. In addition, a portion of the light output of the light source 104 can transmit through a lens 314, and be received by another optical fiber. The other optical fiber can further be coupled with the reference channel of the spectrometer 112. In FIG. 3D, a portion of the light output of the light source 104 can transmit through a lens 314 and received by one or more photodiodes 318. The photodiodes 318 further measures the intensity of the received reference light beam 126.

Figure 4A:
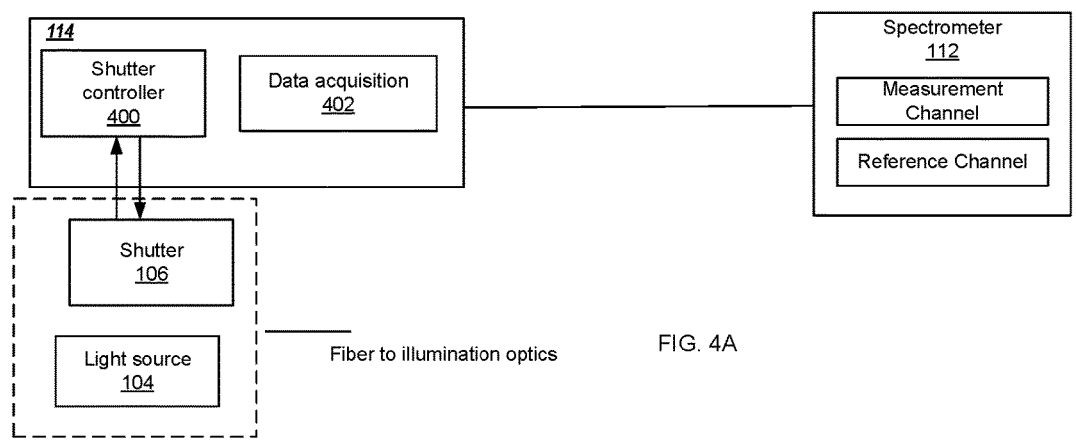
FIG. 4A is a block diagram of an optical modulation/shutter module in accordance with some embodiments.

FIG. 4A is a block diagram of an optical modulation/shutter module according to one example. In one implementation, the shutter 106 may move back and forth between two positions to block or allow the incident light beam 120 into the plasma processing chamber 124. The shutter 106 may include a stepper motor. The shutter 106 with a stepper motor provides high switching speed and high repeatability and reliability. The shutter 106 may be controlled via a shutter controller 400 synchronized with the spectrometer 112. The data acquisition module 402 is connected to the reference channel of the spectrometer 112 and the measurement channel of the spectrometer 112. In one implementation, the shutter 106 may be a continuous rotation optical chopper.

Figure 4B:
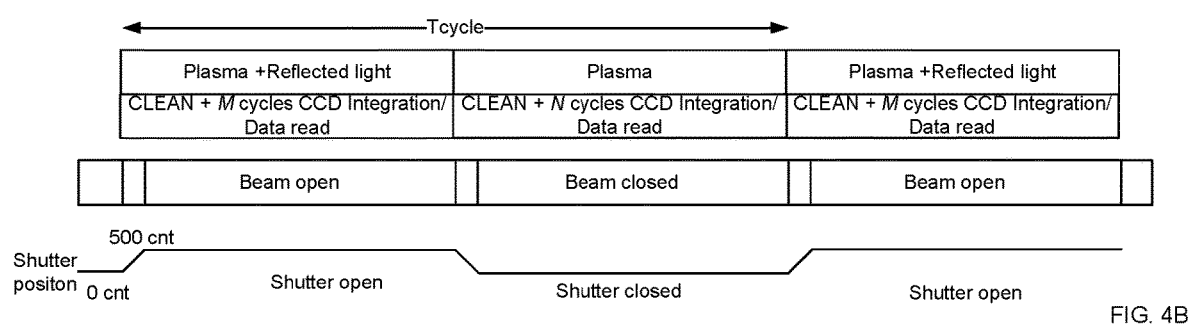
FIG. 4B is a schematic that shows a timing diagram of a shutter in accordance with some embodiments.

FIG. 4B is a schematic that shows a timing diagram of the shutter 106 according to one example. The read out of the charged coupled device (CCD) has a clean cycle. When the shutter is open, the incident light beam 120 reaches the substrate 116 and thus, the measured light by the measurement channel of the spectrometer 112 is indicative of the reflected light beam 122 and the background light (e.g., plasma emission light). M cycles (i.e., CCD integration/data read) can be measured and averaged to improve signal to noise ratio (SNR). When the shutter is closed, the incident light beam 120 does not reach the substrate 116 and thus the light measured by the measurement channel of the spectrometer 112 is indicative of the background light (e.g., plasma emission light). N cycles (i.e., CCD integration/data read) can be measured and averaged to improve SNR. Thus, the controller 114 may process the collected intensities (e.g., subtract plasma intensity) in order to determine the feature dimension (e.g., thickness) from the reflected light intensity.

Physical features may be determined using multiple methods from the collected spectrum. For example, physical features may be determined by referencing a library to match the detected spectrum with a pre-calculated and pre-stored spectrum. In one implementation, direct physical regression models may be used to obtain film thickness for un-patterned wafers. Regression model may also be used to measure critical dimensions (CDs) and other pattern parameters, of simple patterns such as 2D lines.

In some implementations, machine learning techniques (e.g., neural network, information fuzzy network) may be used. A supervised training method trains a machine leaning algorithm to build a relationship between properties (e.g., CDs, thicknesses, etc.) of the sample and the collected spectrum. During the training phase of the machine learning method, the spectra from samples are collected. The properties associated with each sample may be obtained from CD metrology tools. Then, the machine learning algorithm is trained by using the collected spectral data and the properties of each sample.

At the real-time application stage, the trained machine learning algorithm is deployed to predict target end-point based on target properties of each wafer. Spectra collected during the etching process are compared with the predicted target end-point spectra to indicating the reaching of the target properties for each wafer.

Figure 5:
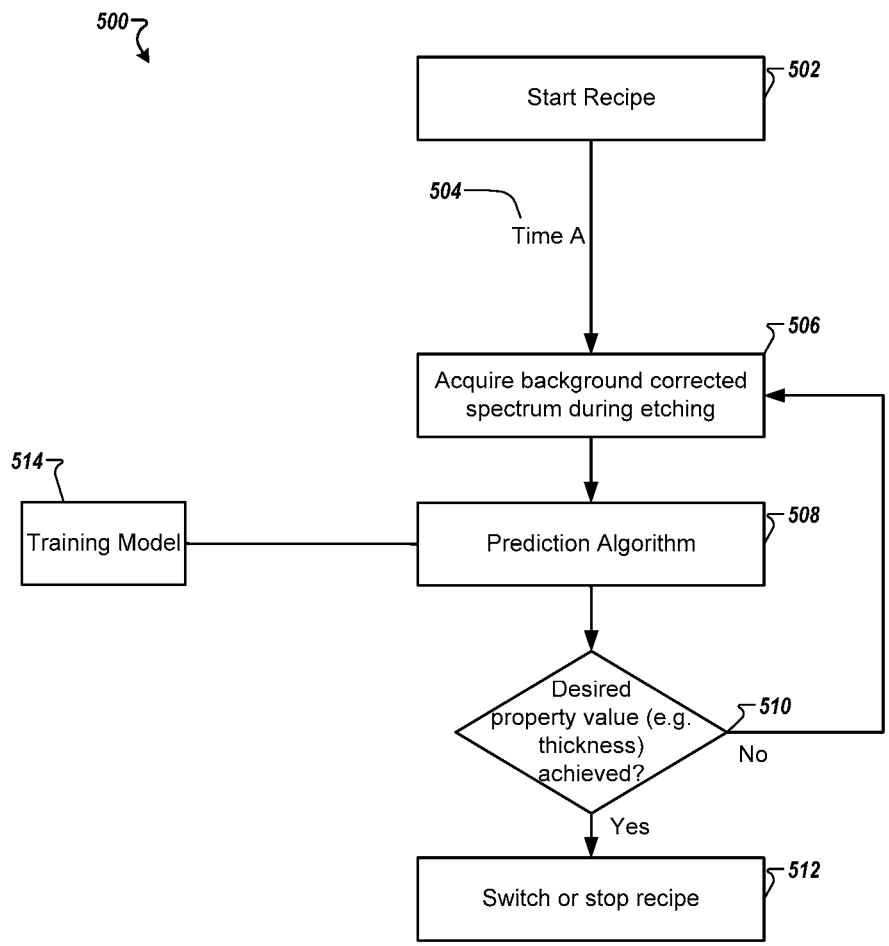
FIG. 5 is a flowchart that shows a method for in-situ monitoring of an etch process in accordance with some embodiments.

FIG. 5 is a flowchart that shows a method 500 for in-situ monitoring of an etch process according to one example. At step 502, the etching process recipe starts. After a certain time (e.g., Time A≥0 sec) of plasma etching at step 504, the method 500 proceeds to step 506. At step 506, the spectral intensity of the reflected light beam from the substrate 116 and the spectral intensity of the background light are measured. The controller 114 processes the measured spectral intensity of the reflected light beam 122 to optionally suppress (e.g., subtract or filter) the background light to obtain background corrected spectrum during plasma etching. For example, the controller 114 can subtract the spectral intensity of the background light from the spectral intensity of the reflected light beam 122.

At step 508, a prediction algorithm, such as a machine learning algorithm or a polynomial algorithm, analyzes the acquired spectra based on a training model 514 and associates a particular property (e.g. thickness) of the substrate or structures formed thereupon to that spectrum.

Then, at step 510, in response to determining that the property of the substrate or structures formed thereupon has been achieved, the process proceeds to step 512. In response to determining that the property of the substrate or structures formed thereupon has not been achieved, the process goes back to step 506. At step 512, the controller 114 may modify the etching process, for example, switch or stop the recipe, or change the recipe to a different recipe when the measurement indicates that the process is getting close to completion.

The algorithms can also use periodic measurements on one or more reference substrates (calibration), such as a bare silicon wafer and/or thin-film wafers, to compensate for optical sensor or etch chamber components drifts. During calibration of the system, a beam may be reflected from a bare (i.e., unpatterned) silicon wafer or other wafer of known properties. The reflected beam is used to calibrate for any changes in the optical sensor 101, for example due to the clouding of windows (e.g., windows 202 and 204) by products of the plasma process. The recalibration may be applied when a predetermined number of wafers have been processed in the plasma processing system 100.

Figure 6:
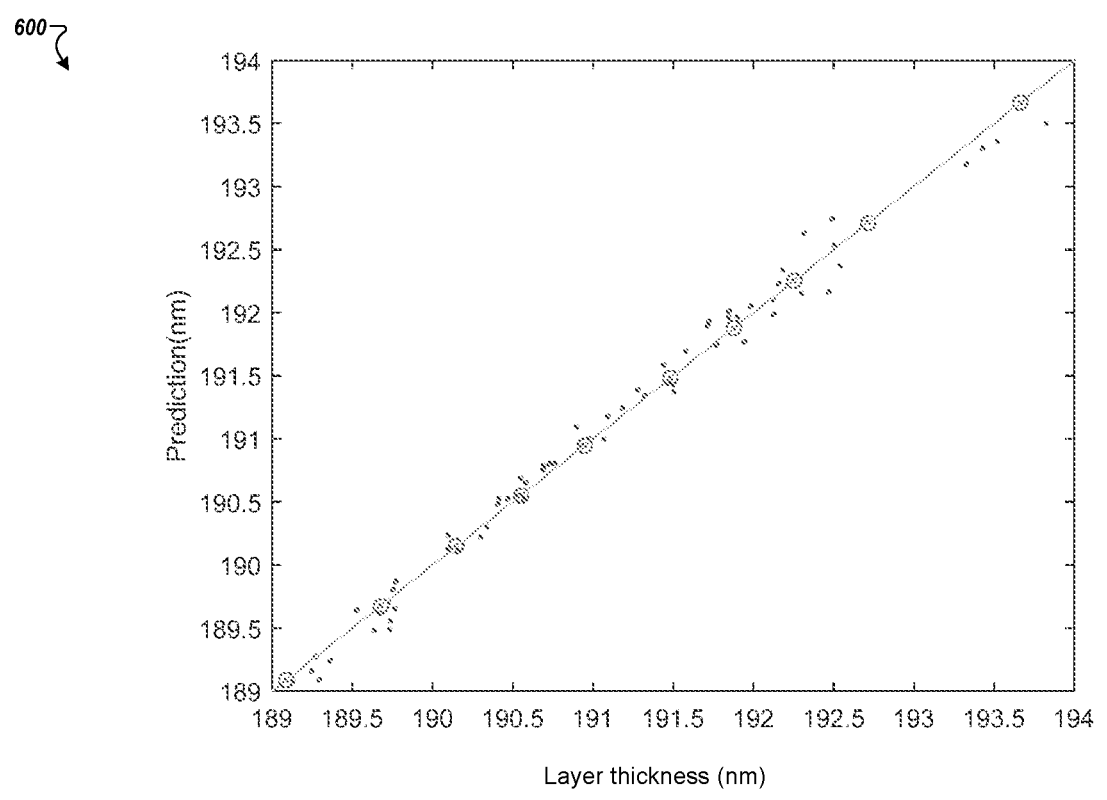
FIG. 6 is a schematic that shows exemplary results.

FIG. 6 is an exemplary schematic that shows exemplary results. Detection of thickness by the optical sensor 101 disclosed herein was compared to other detection methods and models. For example, a reference wafer map having M sites may be used. N sites out of the M sites that represent the range of a layer thickness in the wafer map are selected by the inventors. The selected N sites are indicated by circles in schematic 600. The linear nature of the plot shown in schematic 600 indicates a good agreement between measurements made with the optical sensor 101 described herein (vertical axis) and measurements made with another tool (e.g., a metrology tool).

Figure 7:
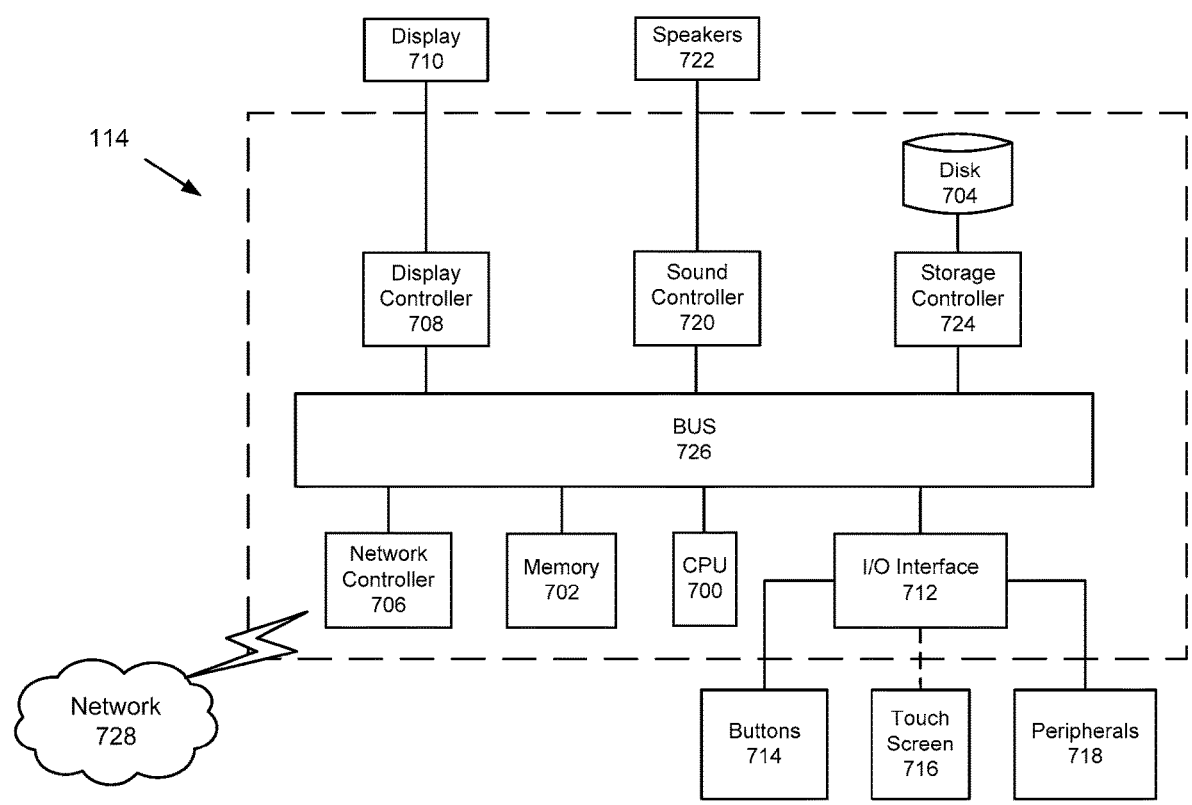
FIG. 7 is an exemplary block diagram of a controller in accordance with some embodiments.

Next, a hardware description of the controller 114 according to exemplary embodiments is described with reference to FIG. 7. In FIG. 7, the controller 114 includes a CPU 700 which performs the processes described herein. The process data and instructions may be stored in memory 702. These processes and instructions may also be stored on a storage medium disk 704 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the controller 114 communicates, such as a server or computer.

Further, the claimed advancements may be provided as a utility application, background daemon, or component of an operating system, or combination thereof, executing in conjunction with CPU 700 and an operating system such as Microsoft® Windows®, UNIX®, Oracle® Solaris, LINUX®, Apple macOS™ and other systems known to those skilled in the art.

In order to achieve the controller 114, the hardware elements may be realized by various circuitry elements, known to those skilled in the art. For example, CPU 700 may be a Xenon or Core processor from Intel of America or an Opteron processor from AMD of America, or may be other processor types that would be recognized by one of ordinary skill in the art. Alternatively, the CPU 700 may be implemented on an FPGA, ASIC, PLD or using discrete logic circuits, as one of ordinary skill in the art would recognize. Further, CPU 700 may be implemented as multiple processors cooperatively working in parallel to perform the instructions of the inventive processes described above.

The controller 114 in FIG. 7 also includes a network controller 706, such as an Intel Ethernet PRO network interface card from Intel Corporation of America, for interfacing with network 728. As can be appreciated, the network 728 can be a public network, such as the Internet, or a private network such as LAN or WAN network, or any combination thereof and can also include PSTN or ISDN sub-networks. The network 728 can also be wired, such as an Ethernet network, or can be wireless such as a cellular network including EDGE, 3G, 4G and 5G wireless cellular systems. The wireless network can also be WiFi®, Bluetooth®, or any other wireless form of communication that is known.

The controller 114 further includes a display controller 708, such as a NVIDIA® GeForce® GTX or Quadro® graphics adaptor from NVIDIA Corporation of America for interfacing with display 710, such as a Hewlett Packard® HPL2445w LCD monitor. A general purpose I/O interface 712 interfaces with a keyboard and/or mouse 714 as well as an optional touch screen panel 716 on or separate from display 710. General purpose I/O interface also connects to a variety of peripherals 718 including printers and scanners, such as an OfficeJet® or DeskJet® from Hewlett Packard.

A sound controller 720 is also provided in the controller 114, such as Sound Blaster® X-Fi Titanium® from Creative, to interface with speakers/microphone 722 thereby providing sounds and/or music.

The general purpose storage controller 724 connects the storage medium disk 704 with communication bus 726, which may be an ISA, EISA, VESA, PCI, or similar, for interconnecting all of the components of the controller 114. A description of the general features and functionality of the display 710, keyboard and/or mouse 714, as well as the display controller 708, general purpose storage controller 724, network controller 706, sound controller 720, and general purpose I/O interface 712 is omitted herein for brevity as these features are known.

A system which includes the features in the foregoing description provides numerous advantages to users. The disclosed normal-incidence in-situ process monitor sensor provides increased sensitivity (signal to noise ratio) to related technologies because the normal incidence reflectometer with zero degree angle of incidence (AOI) has better measurement sensitivity. In addition, the disclosed sensor has a lower cost because only one optics module is required. The disclosed sensor has a compact design, and requires minimum chamber modification and minimum on-chamber alignment. Further, the disclosed sensor can eliminate the shutter for plasma background correction due to the increased sensitivity. For example, collection of p-polarized light reflected from the substrate 116 results in better signal purity. The disclosed sensor can be used for different wafer structures.

Obviously, numerous modifications and variations are possible in light of the above teachings. It is therefore to be understood that within the scope of the appended claims, the invention may be practiced otherwise than as specifically described herein. Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

What is claimed is:

1. An apparatus for in-situ etch process monitoring in a plasma processing chamber, the apparatus comprising:
   a continuous wave broadband light source;
   an illumination system configured to illuminate an area on a substrate with an incident light beam being directed from the continuous wave broadband light source at normal incidence to the substrate;
   a collection system configured to collect a reflected light beam being reflected from the illuminated area on the substrate, and to direct the reflected light beam to a first light detector; and
   a controller configured to determine a property of the substrate or structures formed thereupon based on a reference light beam and the reflected light beam, and control an etch process based on the determined property,
   wherein the reference light beam is generated by the illumination system by splitting a portion of the incident light beam through a beam splitter or using a mirror, thereafter directing the reference light beam to a second light detector.

2. The apparatus of claim 1, wherein the second light detector comprises a photodiode or a spectrometer.

3. The apparatus of claim 1, wherein the continuous wave broadband light source is laser-driven broadband light source with a wavelength range from 190 nm to 2000 nm.

4. The apparatus of claim 1, wherein the illumination system includes a first polarizer and the incident light beam is passed through the first polarizer before being directed to the substrate.

5. The apparatus of claim 1, wherein the collection system includes a second polarizer and the reflected light beam is passed through the second polarizer before being directed to the first light detector.

6. The apparatus of claim 1, wherein the illumination system includes a first off-axis parabolic mirror and a beam splitter to direct the incident light beam to the substrate.

7. The apparatus of claim 1, wherein the collection system includes a second off-axis parabolic mirror and a fold mirror to direct the reflected light beam to the first light detector.

8. The apparatus of claim 1, wherein the first light detector is a dual-channel broad-band high SNR (signal to ratio) spectrometer including a measurement channel to receive the reflected light beam.

9. The apparatus of claim 1, wherein the controller is further configured to:
   store a prediction algorithm that is indicative of a correlation between (i) a property of a sample substrate or structures formed thereupon and (ii) a spectral intensity of a reflected light beam collected from the sample substrate or structures formed thereupon; and
   determine the property of the substrate or structures formed thereupon by applying the stored prediction algorithm to a spectral intensity of the collected reflected light beam through the collection system.

10. The apparatus of claim 9, wherein the prediction algorithm comprises a machine learning model and includes at least one of a convolutional neural network (CNN) and a supervised machine learning model.

* * * * *